ated PROMs.
United States Patent [19]
Boudou et al.

[11] Patent Number: 5,281,553
[45] Date of Patent: Jan. 25, 1994

[54] METHOD FOR CONTROLLING THE STATE OF CONDUCTION OF AN MOS TRANSISTOR OF AN INTEGRATED CIRCUIT

[75] Inventors: Alain Boudou, Vert; Marie-Francois Bonnal, Fontenay Le Fleury; Martine Rouillon-Martin, Bailly, all of France

[73] Assignee: Bull, S.A., Paris, France

[21] Appl. No.: 658,465

[22] Filed: Feb. 22, 1991

Related U.S. Application Data

[63] Continuation of Ser. No. 214,467, Jul. 1, 1988, abandoned.

[30] Foreign Application Priority Data

Jul. 2, 1987 [FR] France ................ 87 09381

[51] Int. Cl.$^5$ ............. H01L 21/00; H01L 21/02; H01L 21/26; H01L 21/268
[52] U.S. Cl. ................ 437/173; 437/51; 437/52; 148/DIG. 91; 148/DIG. 93
[58] Field of Search ............. 437/40, 41, 51, 52, 437/173, 174; 357/23.1, 23.6, 23.9; 365/103, 104, 105, 114, 115; 148/DIG. 91, DIG. 93

[56] References Cited

U.S. PATENT DOCUMENTS

| | | | |
|---|---|---|---|
| 3,795,974 | 3/1974 | Calhoun | 29/574 |
| 3,999,212 | 12/1976 | Usuda | 357/23.13 |
| 4,044,373 | 8/1977 | Nomiya et al. | 357/49 |
| 4,238,839 | 12/1980 | Redfern et al. | 357/41 |
| 4,240,094 | 12/1980 | Mader | 357/45 |
| 4,387,503 | 6/1983 | Aswell et al. | 437/173 |
| 4,455,495 | 6/1984 | Masuhara et al. | 357/51 |
| 4,531,144 | 7/1985 | Holmberg | 357/71 |
| 4,658,379 | 4/1987 | Fujishima et al. | 365/200 |
| 4,665,295 | 5/1987 | McDavid | 437/173 |
| 4,751,197 | 6/1988 | Wills | 437/174 |
| 4,783,424 | 11/1988 | Ohno | 437/40 |
| 4,872,140 | 10/1989 | Graham et al. | 365/96 |
| 4,897,836 | 1/1990 | Fitzpatrick et al. | 370/112 |

FOREIGN PATENT DOCUMENTS

| | | |
|---|---|---|
| 0252814 | 1/1988 | European Pat. Off. . |
| 297963A | 1/1989 | European Pat. Off. . |
| 3036869A | 4/1981 | Fed. Rep. of Germany . |
| 0050531 | 5/1981 | Japan . |
| 0157559 | 9/1982 | Japan . |
| 58-182851 | 10/1983 | Japan . |
| 0080973 | 5/1984 | Japan . |
| 61-46045 | 3/1986 | Japan . |
| 0173505 | 7/1989 | Japan . |

OTHER PUBLICATIONS

Raffel, A laser-restructurable logic array for rapid integrated circuit prototyping, Linc. Lab. J. (USA), vol. 4, No. 2, 1991, pp. 97-112.
Rouillon-Martin, Laser programmable vias for reconfiguration of integrated circuits, Proc. SPIE-Int. Soc. Opt. Eng. (USA), vol. 1138, 1989, pp. 190-197.
Carlson, Electrical Engineering Concepts and Applications, Addison-Wesley, 1981, p. 358.
Smith et al; "Laser Induced Personalization & Alterations of LSI & VLSI Circuits"; Proceedings Laser Processing Conference Nov. 16-17, 1981.
Ewald et al, "Fusible Link Device"; IBM Technical Discl. Bull., Jan., 1977.
Wu, Wei-Wha; "Automated Welding Customizes Programmable Logic Arrays"; Jul. 1982; Electronics Int. vol. 55, No. 14 pp. 159-162.
Chen et al, "Electrical Breakdown in Thin Gate and Tunneling Oxides", 8107 IEEE Transactions on Magnetics, SC20 (1985) Feb., No. 1.

*Primary Examiner*—Brian E. Hearn
*Assistant Examiner*—B. Everhart
*Attorney, Agent, or Firm*—Kerkam, Stowell, Kondracki & Clarke

[57] ABSTRACT

The state of conduction of an MOS transistor 11 is definitively controlled by a laser beam 21, by forming an electrical connection 22 between the gate 16 and the subjacent portion d of the source region 14 or drain region 15. The invention is applicable in particular to the correction (reconfiguration, redundancy) of integrated circuits and to the programming of integrated PROMs.

36 Claims, 1 Drawing Sheet

U.S. Patent
Jan. 25, 1994
5,281,553
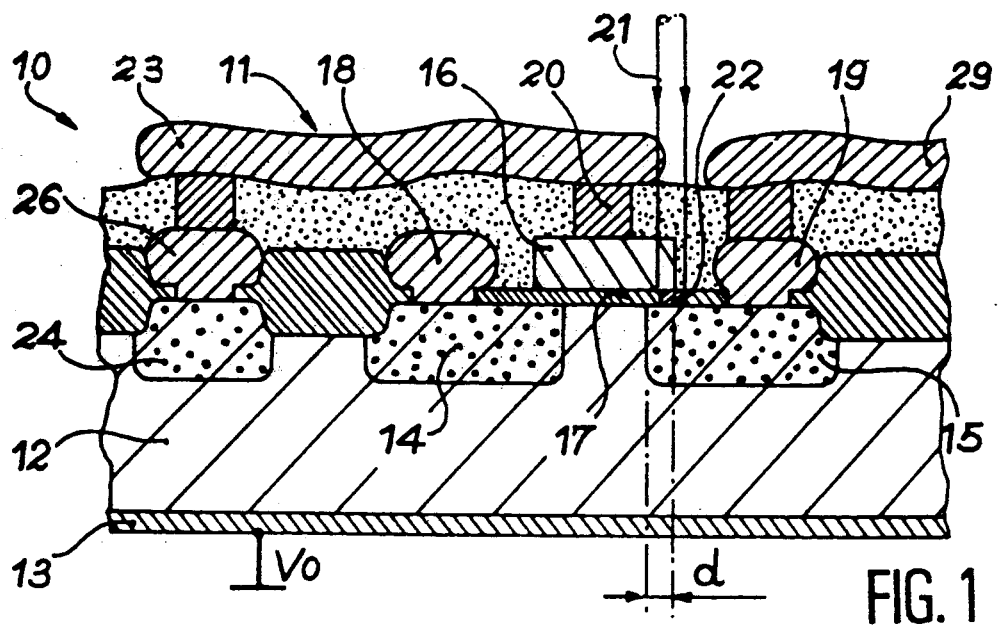
FIG. 1
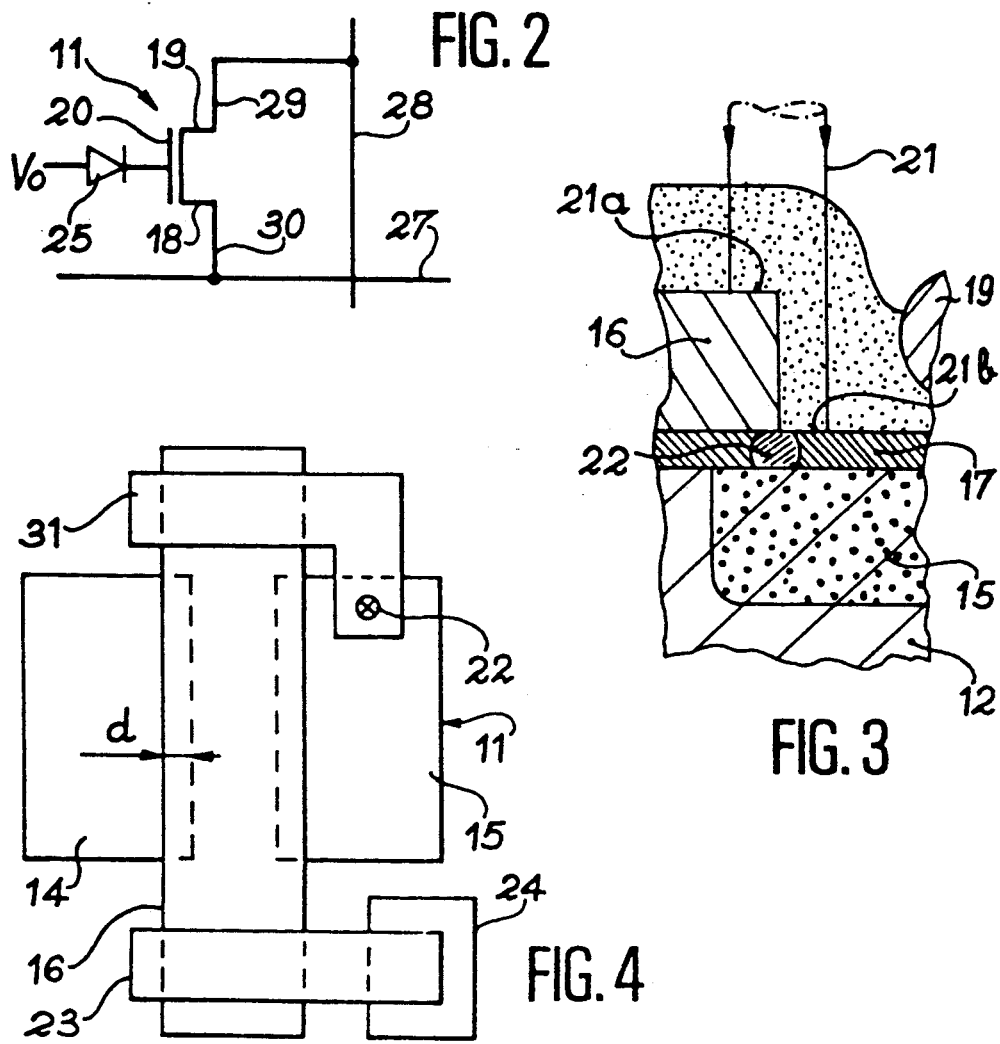
FIG. 2
FIG. 3
FIG. 4

METHOD FOR CONTROLLING THE STATE OF CONDUCTION OF AN MOS TRANSISTOR OF AN INTEGRATED CIRCUIT

This is a continuation of application Ser. No. 07/214,467, filed Jul. 1, 1988, now abandoned.

FIELD OF THE INVENTION

The invention relates to a method for controlling the state of conduction of an MOS transistor and to the integrated circuit, commonly known as a chip, utilizing the method.

BACKGROUND OF THE INVENTION

The invention applies generally to the manufacture and design of circuits that are integrated in the monocrystalline semiconductor substrate of a chip and are produced from MOSFETs (metal oxide semiconductor field effect transistors). The invention advantageously applies to the manufacture and design of large-sized, very large scale integration chips, or VSLI chips, and particularly to the chips that include a programmable read only memory. At present in the manufacture and design of large scale integrated circuits attempts are being made to use the laser widely, to modify the circuits of the chips. Circuit modification is naturally done, when the chip is a programmable read only memory or includes such a memory. Laser programming thus serves to determine the state of conduction of the memory cells. On the other hand, a modification of the circuits of the chip is presently done to correct certain connection defects. Generally, laser programming as a function of the integrated circuits of a chip has numerous applications and numerous advantages.

An integrated circuit is essentially a semiconductor substrate including doped regions for comprising electronic components and having an interconnect structure of these components. The interconnect structure rests on the substrate via a dielectric silicon dioxide (SiO2) layer formed by growth of the material of the substrate. The dielectric layer is generally thin above the doped regions, being on the order of several tens of nanometers, and thick (several nanometers thick) between these regions. The interconnect structure presently comprises a plurality of conductive layers separated by insulating layers and connected to one another at certain points by vias passing through the insulating layers. Each conductive layer comprises numerous conductors parallel to one another in a direction orthogonal to the conductors of a neighboring conductive layer. Conductors of the lower layer are connected with the corresponding regions of the substrate via openings made in the thin dielectric layer covering these regions.

At present, manufacturing very large scale integrated circuits on large sized chips produces only a low percentage of chips that are not defective. Defects may be either in the semiconductor substrate or in the interconnect structure formed on the substrate for connecting the components of the chip. Several methods for correcting defects, to increase the percentage of usable chips, are known. These correction methods involve the reconfiguration of the circuits or redundancy of functional blocks. Reconfiguration comprises modifying the wiring or the function of a defective circuit, while redundancy comprises substituting a homologous block, especially provided for correction, for a defective block.

Reconfiguration and redundancy are done by the intermediary of additional wiring designed to be connected to the defective wiring by a predetermined connection program. More precisely, the design of integrated circuits in a chip provides that the original conductors of certain functional blocks or elements of the chip cooperate with the substitute conductors of the corresponding correction circuit. The original conductors and the substitute conductors may be wires of the interconnect structure or of the doped regions of the substrate. The correction comprises inhibiting the defective functional blocks or elements and connecting their original conductors to corresponding substitute conductors.

Several programming methods, in particular for programmable read only memories or for correcting circuits, are presently in use. However, these methods avoid resorting to control of the conduction of a transistor bonding device for connecting one conductor to another conductor. In fact, the device for polarizing and controlling the bonding transistor or transistors would involve a complex and expensive bonding device of relatively large surface area. Considering the great number of bonds to be provided on one large-sized VLSI chip, the surface area and cost of the set of bonding devices would be prohibitive. Consequently, programming methods tend to make maximum use of bonds that are programmable by laser beam. These bonds are made between two superimposed conductors insulated from one another by an insulating layer. The design of the integrated circuits thus comprises superimposing an original conductor, in particular by growth, and the corresponding substitute conductor for circuit correction, or the two line and column conductors of a programmable read only memory (PROM). However, the conventional connection by laser in the zones of superposition of the two conductors requires that the upper conductor be placed at a level above the interconnect structure. This constraint greatly complicates the wiring and makes the channels provided for the interconnections of the interconnect structure undesirably bulky. This is also true if the defective functional blocks and elements are isolated by laser cutting.

SUMMARY OF THE INVENTION

It is accordingly desirable for programming to be done via transistor bonding devices that ar simple to control by laser, are not very bulky and have minimal cost. In fact, these bonding devices are formed at the level of the substrate and can be disposed in such a manner that the bonds are as short as possible. These bonding devices would thus make it possible to reduce the bulk of the interconnect structure and would facilitate its design.

The invention enables simple control of the state of conduction of an MOS transistor. This control cannot affect any additional element besides the transistor and thus solves the problem of bulk. Moreover, the control can be done after manufacture of the chip, that is, after the passivation layer has been deposited. Moreover, the control according to the invention is able to leave practically no visible trace, as viewed under the optical microscope, of the modification of the state of conduction of the MOS transistor.

The method according to the invention for controlling the state of conduction of an MOS transistor is characterized in that it comprising forming an electrical bond, which includes a connection by laser, between the gate and the source or drain region.

As a corollary, an integrated circuit according to the invention, including at least one MOS transistor, in characterized in that the gate of the transistor is connected to its source or drain region.

The characteristics and advantages of the invention will become apparent from the ensuing description of an exemplary embodiment, taken in conjunction with the drawings.

BRIEF DESCRIPTION OF THE DRAWINGS

FIG. 1 is a fragmentary vertical cross section of an MOS transistor of an integrated circuit according to the invention;

FIG. 2 is a schematic view of the MOS transistor shown in FIG. 1;

FIG. 3 is a detail view, on a larger scale, of the transistor shown in FIG. 1 and illustrates one embodiment of a connection in accordance with the invention; and FIG. 4 is a plan view of an MOS transistor, showing a variant of the method and of the integrated circuit according to the invention.

DESCRIPTION OF THE PREFERRED EMBODIMENT

FIG. 1, in fragmentary cross section, show an integrated circuit 10 according to the invention, simply known as a chip. The section is taken at the level of an MOS transistor 11 assembled in the fashion schematically shown in FIG. 2. In FIG. 1 and in FIGS. 3 and 4, the actual proportions in terms of length have not been adhered to, for the sake of clarity in the drawing, and will naturally be corrected by one skilled in the art. The transistor 11 is formed on one face of the semiconductor substrate 12 of the chip 10. It is assumed that the substrate 12 is of p-type monocrystalline silicon. The other face of the substrate is covered with a substrate electrode 13 connected to a substrate voltage Vo. The transistor 11 comprises a source region 14, a drain region 15 and a gate 16. The source and drain regions 14, 15 are thus of the n+type and are formed beneath a thin dielectric layer 17, ordinarily of silicon dioxide ($SiO_2$) obtained by growth of the substrate 12. The dielectric layer 17 is open at the level of the source and drain regions 14, 15 to form the respective source and drain electrodes 18 and 19. The gate 16 is formed above the thin dielectric layer 17, between the source and drain regions 14, 15. Ordinarily, the diffusion of the dopants into the source and drain regions 14, 15 during annealing causes these regions to flow underneath the gate by a distance d as shown. The gate may be of metal or highly doped polycrystalline silicon (polysilicon), or an alloy of the two. It comes into contact with a metal portion comprising the gate electrode 20.

The invention comprises definitively controlling the state of conduction of the MOS transistor 11, by forming an electrical bond including a connection by laser between the gate 16 and the source or drain region 14 or 15. In the example of FIG. 1, a laser beam 21 is aimed perpendicular to the substrate 12 at one of the edges of the gate 16 that covers the source and drain regions 14, 15 over the distance d. The connection shown, 22, is made between the gate 16 and the drain region 15. The connection 22 creates a short circuit or an electrical bond of low resistance between the gate 16 and the drain region 15. The MOS transistor 11 is thus put definitively into a positive conduction state as soon as adequate voltages are applied to the electrodes 18, 19 and 20 of the transistor 11. The negative conduction state (blockage) of the transistor I1 is definitively determined by placing the laser connection 22 between the gate 16 and the source region 14.

The connection 22 made with the laser beam 21 can be done conventionally, such as described in the article by Platakis, "Mechanism of laser-induced metal-semiconductor electrical connections in MOS structures", published in the Journal of Applied Physics, Vol. 47, No. 5, May 1976. However, this method has the disadvantage of using a high-energy laser beam and of forming a crater capable of perturbing the function of the transistor. Another disadvantage is that it requires that the connection be made prior to the formation of any electrically conductive or insulating layer capable of covering the upper conductor to be connected, in this case the gate 16. In other words, in the present case this connection method must be performed prior to the formation of the interconnect structure. Among the methods that can be used, the most suitable one is as follows. By this method, the beam 21 is applied to straddle the edge of the gate 16 and the source region 14 or drain region 15 of the transistor 11. FIG. 3 is a large-scale detail view of FIG. 1 at the level of the gate 16 and drain region 15 for the formation of the connection 22 by this method of using the laser beam 21. It can be seen that the laser beam 21 is divided into one portion 21a on the edge of the gate 16 and one portion 21b on the thin dielectric layer 17 covering the drain region 15. By this method, the power of the laser beam, its diameter and the number and duration of pulses are determined in such a manner as to create definitive defects, which are constitutents of a low electrical resistance, in the thin dielectric layer 17. This connection has numerous advantages. First, it is made with a low-energy laser beam 21. Next, the connection 22 is produced only at the level of the thin dielectric layer 17. It is assumed that the low energy of the laser beam 21 is sufficient to create defects in the thin layer 17 that are sufficient to definitively obtain an effective and reliable connection 22. It has been found in fact that this connection is practically invisible under the optical microscope and can thus preserve the secrecy of information contained in the chip, in particular in the transistors according to the invention. Furthermore, because of the low power required of the laser beam, the connection 22 can be made in the presence of the interconnect structure, and even in the presence of the passivation layer, which is intended to cover this structure, for the sake of physically, electrically and chemically protecting the circuits of the chip.

The following experiment is a typical illustration of this method. In the transistor 11, the regions 14 and 15 were 0.4 micrometers deep, the gate 16 was made of highly doped polysilicon on a thickness of 0.5 micrometers, the insulating layer covering the gate was approximately 1 micrometers in thickness and the thin silicon dioxide layer 17 was 70 nanometers thick. The beam 21 was 5 micrometers in diameter and had a power of 0.76 watts. The application of a single pulse 1 millisecond in duration was sufficient to create the connection 22, the measured resistance of which was on the order of 350$\Omega$. Various tests done under various conditions have shown that this method can also be applied to metal gates, and that the resistance of the connection 22 is in the range between 100$\Omega$ and several k$\Omega$ and particularly between 300$\Omega$ and 3k$\Omega$. These values depend on various parameters used relating to the laser beam and the structural elements of the transistor 11 involved.

FIGS. 1 and 2 also show a preferred mode of using a transistor 11 intended to be used in accordance with the invention as described above. The gate electrode 20 is connected by a conductor 23 to an independent region 24 of the transistor 11, of the n+type. The region 24 shown is insulated and has a floating potential. Advantageously, this region 24 and the substrate 12 form a diode 25. The anode of this diode is formed by the substrate 12, and the anode electrode is formed by the substrate electrode 13. The cathode of the diode 25 comprises the region 24, and the cathode electrode 26 is the end portion of the conductor 23. Thus by applying ground voltage (0 volts) to the source electrode 18 and a sufficient drain voltage to the electrode 19, the transistor 11 provided with its connection 22 at the level of the drain region 15 is put into its positive conduction state. Its gate current comprises the inverse conduction current of the diode 25 (leakage current of the diode) sufficient to polarize the junction of the diode (region 24/substrate 12) and the gate 16 via the conductor 23.

This mode of attaining the polarization of a transistor 11 according to the invention is highly advantageous. A single transistor suffices. The diode 25 can be made in proximity with the transistor 11, so as to make a simple and very compact unit. Moreover, this assembly is not very expensive. The region 24 is made in the same manner as the source and drain regions 14, 15, and the connection 22 can be made simply.

FIGS. 1 and 2 also serve to illustrate various examples of application of the transistor 11 and its diode 25 to the bonding of a conductor 27 with an associated conductor 28. The drain electrode 19 is connected via a conductor 29 to the conductor 28, while the source electrode 18 is connected to the conductor 27 via a conductor 30. At their ends, the conductors 27 and 2 receive voltages sufficient to polarize the transistor 11. In one possible application, the conductor 27 is the original conductor of a defective functional block or element, and the conductor 28 is the substitute conductor disposed for the sake of redundancy. On the other hand, for reconfiguration of a defective functional block or element, the invention can be used to modify the state of logic gates, in a manner that will be readily apparent to one skilled in the art. In another example, the conductors 27 and 28 comprise the line and column wires, respectively, of a PROM, each cell of which includes the transistor 11, optionally associated with the diode 25. In fact, the diode 25 could be replaced with any arbitrary polarizing device.

FIG. 4 illustrates a variant for attaining the electrical bond used in accordance with the invention for connecting the gate 16 to the source or drain region 14 or 15 of an MOS transistor 11. Elements similar to those of the foregoing drawing figures have the same reference numerals. Elements that have been modified have numerals raised with a prime ('). The transistor 11 of FIG. 4 is illustrated in plan view. For the sake of convenience, this view has been drawn in the absence of conductors not affected by the invention in the interconnect structure of the integrated circuit 10. Thus in the example shown, the source and drain regions 14, 15 are rectangular regions. The gate 16 is strip-like in shape. The sectional view of this transistor corresponds to FIG. 1. However, in a variant embodiment according to the invention, the bond between the gate 16 and the source or drain region 14 or 15 is accomplished by a conductor 31 that connects the gate to the source region 14 or the drain region 15. The conductor 31 illustrated connects the gate 16 with the drain region 15.

The conductor 31 may be an extension of the gate 16, or may be made of different material. The connection 2 made by laser can be made at the level of the drain region 15 or at the level of the superposition of the conductor 31 on the gate 16. This variant is preferable when direct bonding, by the simple connection 22 as shown in FIG. 1, either cannot be done or would be deleterious to the functioning of the transistor. For example, using the laser beam 21 for forming a crater requires that the laser beam 21 strike the gate 16 directly, without the intermediary of an interconnect structure layer. Because of the variant shown in FIG. 4, the conductor 31, optionally linked with other bonding conductors, can make it possible to form a crater 22 at the level above the interconnect structure. The variant shown in FIG. 4 can also be used when it is desired to use the laser-made connection in accordance with the method described in conjunction with FIG. 3. It has been found that the connection 22 made by this method is impossible if the gate 16 is made of a doped semiconductor material of some other type than that of the source and drain regions 14, 15. This may for instance be the case with CMOS circuits. The variant shown in FIG. 4 has the advantage of using this method of connection by laser, by making the conductor 31 compatible with this method. For example, the conductor 31 may be of metal or doped with dopants of the same type as the adjacent source or drain region. In the case where the laser beam 21 is used by the method described in conjunction with FIG. 3, this beam would of course be placed to straddle one edge of the conductor 31 and the corresponding conductor element to be connected. This can also be done for bonding the conductor 23.

What is claimed is:

1. A method of turning on an MOS transistor (11) having a source region (14), a drain region (15), a dielectric layer (17) and a gate (16) on a face of a substrate (12) of an integrated circuit (10), comprising: providing the gate with an extension conductor (31) having a portion outside the drain region and a portion projecting over said drain region over the dielectric layer, forming an electric connection by laser between the projecting portion of the extension conductor and the drain region, and providing biasing means (Vo, 25) connected to the gate and enabled by said electrical connection.

2. The method as defined by claim 1, wherein the formation of the laser connection comprises: directing a laser beam to impinge upon adjacent portions of the extension conductor and said drain region, and controlling the power (P), the diameter (D), the number (N) and duration (T) of the pulses of the laser beam so as to definitively create in the dielectric layer a zone of a low electrical resistance said zone comprising a portion under said projecting portion, and wherein the formation of the laser connection produces no opening through the projecting portion of the extension conductor.

3. The method as defined by claim 2, wherein the extension conductor is made of metal.

4. The method as defined by claim 2, wherein the extension conductor includes dopants of the same conductivity type as those in the region over which said portion of said extension conductor projects.

5. The method as defined by claim 3, wherein the extension conductor is made of a material different from that of the gate.

6. The method as defined by claim 4, wherein the extension conductor is made of a material different from that of the gate.

7. The method as defined by claim 2, comprising the further step of covering the substrate with at least one additional conductor layer.

8. The method as defined by claim 2, comprising the further step of covering the substrate with at least one insulating layer.

9. A method of turning on an MOS transistor (11) having a source region (14), a drain region (15), a dielectric layer (17) and a gate (16) on a face of a substrate (12) of an integrated circuit (10), the source and drain regions extending underneath respective overlapping portions of the gate, comprising forming biasing means (Vo, 25) connected to said gate, directing a laser beam (21) to impinge upon an edge of the gate said edge being disposed at one of said overlapping portions and the drain region and controlling the power (P), the diameter (D), the number (N) and duration (T) of the pulses of the laser beam so as to definitively create in the dielectric layer a zone of low electrical resistance, said zone comprising a portion under said one overlapping portion of the gate and an adjacent portion outside the gate, wherein said laser beam impingement produces no opening through said one overlapping portion of the gate, said zone and said biasing means thus operating to turn said transistor on.

10. The method as defined by claim 9, wherein said biasing means includes an independent doped region (24) of the substrate.

11. The method as defined by claim 9, wherein said biasing means uses an inverse current of a diode (25) formed by an interface of an independent doped region (24) of the substrate, with the substrate, said independent doped region having a floating potential.

12. The method as defined by claim 9, wherein said gate is made of metal.

13. The method as defined by claim 10, wherein said gate is made of metal.

14. The method as defined by claim 11, wherein said gate is made of metal.

15. The method as defined by claim 9, wherein said source and drain regions of the transistor have dopants of one conductivity type and said gate includes dopants of said conductivity type.

16. The method as defined by claim 10, wherein said source and drain regions of the transistor have dopants of one conductivity type and said gate includes dopants of said conductivity type.

17. The method as defined by claim 11, wherein said source and drain regions of the transistor have dopants of one conductivity type and said gate includes dopants of said conductivity type.

18. The method as defined by claim 9, comprising the further step of covering the substrate with at least one additional conductor layer (18, 19, 20, 23, 29).

19. The method as defined by claim 9, comprising the further step of covering the substrate with at least one insulating layer.

20. The method as defined by claim 2, wherein the extension conductor is an extension of the gate.

21. The method as defined by claim 4, wherein the extension conductor is an extension of the gate.

22. The method as defined by claim 2, wherein the number of pulses is one.

23. The method of claim 1, wherein the formation of the electrical connection by laser comprises directing a laser beam to said projecting portion at a spot located within the projecting portion area and applying a high energy in the laser beam to form a crater through the projecting portion, the dielectric layer and at least partially the drain region.

24. The method as defined by claim 1, wherein said biasing means includes an independent doped region (24) of the substrate.

25. The method as defined by claim 9, wherein said biasing means uses an inverse current of a diode (25) formed by an interface of an independent doped region (24) of the substrate, with the substrate, said independent doped region having a floating potential.

26. The method as defined by claim 9, wherein the number of pulses is one.

27. A method of turning off an MOS transistor (11) having a source region (14), a drain region (15), a dielectric layer (17) and a gate (16) on a face of a substrate (12) of an integrated circuit (10) said gate connected to means biasing the transistor, comprising:
   providing the gate with an extension conductor (31) having a portion outside the source region and a portion projecting over said source region over the dielectric layer (17), forming an electrical connection (22) by laser between the projecting portion of the extension conductor and the source region, said biasing means (Vo, 25) being disabled by said electrical connection.

28. The method as defined by claim 27, wherein the formation of the laser connection comprises:
   directing a laser beam to impinge upon adjacent portions of the extension conductor and said source region, and controlling the power (P), the diameter (D), the number (N) and duration (T) of the pulses of the laser beam so as to definitively create in the dielectric layer a zone of a low electrical resistance comprising a portion under said projecting portion and an adjacent portion outside the projecting portion, wherein said laser beam impingement produces no opening through the projecting portion of the extension conductor.

29. A method of turning off an MOS transistor (11) having a source region (14), a drain region (15), a dielectric layer (17) and a gate (16) on a face of a substrate (12) of an integrated circuit (10), the source and drain regions extending underneath respective overlapping portions of the gate and the gate being connected to means for biasing the transistor, comprising:
   directing a laser beam (21) to impinge upon adjacent areas of the gate, one of said overlapping portions and the source region, and controlling the power (P), the diameter (D), the number (N) and duration (T) of the pulses of the laser beam so as to definitively create in the dielectric layer a zone of low electrical resistance comprising a portion under said one overlapping portion of the gate and an adjacent portion outside the gate, wherein said laser beam impingement produces no opening through said one overlapping portion of the gate, and wherein said biasing means is disabled by said electrical connection.

30. A method of definitively putting an MOS transistor into a conduction or a non-conduction condition, said transistor (11) having a source region (14), a drain region (15), a dielectric layer (17) and a gate (16) on a face of a substrate (12) of an integrated circuit (10), said source and drain regions extending underneath respective overlapping portions of the gate, comprising:

directing a laser beam (21) to impinge upon adjacent areas of the gate, one of said overlapping portion and the adjacent source or drain region, and controlling the power (P), the diameter (D), the number (N) and duration (T) of the pulses of the laser beam so as to definitively create in the dielectric layer a zone of a low electrical resistance comprising a portion under said one overlapping portion of the gate and an adjacent portion outside the gate, wherein said laser beam impingement produces no opening through said one overlapping portion of the gate.

31. A method of definitively putting an MOS transistor (11) into a conduction or a non-conduction condition, said transistor having a source region (14), a drain region (15), a dielectric layer (17) and a gate (16) on a face of a substrate (12) of an integrated circuit (10), comprising:

providing the gate with an extension conductor (31) having a portion outside the source and drain regions and a portion projecting over one of said source or drain regions over the dielectric layer (17), and forming an electrical connection (22) by laser between the projecting portion of the extension conductor and the region underlying the projecting portion.

32. The method as defined by claim 31, wherein the formation of the laser connection comprises:

directing a laser beam to impinge upon adjacent portions of the extension conductor and said underlying region, and controlling the power (P), the diameter (D), the number (N) and duration (T) of the pulses of the laser beam so as to definitively create in the dielectric layer a zone of a low electrical resistance comprising a portion of said dielectric layer under said projecting portion of said extension conductor and an adjacent portion of said dielectric layer outside the projecting portion of said extension conductor, wherein said laser beam impingement produces no opening through the projecting portion of the extension conductor.

33. A method of programming a circuit path (27, 28) on a substrate (12) of an integrated circuit (10), the circuit path including an MOS transistor having a source region (14), a drain region (15), a dielectric layer (17) and a gate (16), the method comprising:

providing the gate with an extension conductor (31) having a portion outside the drain region and a portion projecting over said drain region over the dielectric layer (17), forming an electrical connection (22) by laser between the projecting portion of the extension conductor and the drain region, and providing biasing means (Vo, 25) connected to the gate and wherein said biasing means is enabled by said electrical connection.

34. A method of programming a circuit path (27, 28) on a substrate (12) of an integrated circuit (10), the circuit path including an MOS transistor (11) having a source region (14), a drain region (15), a dielectric layer (17) and a gate (16) on a face of the substrate (12) of the integrated circuit (10), the source and drain regions extending underneath respective overlapping portions of the gate, comprising:

forming biasing means (Vo, 25) connected to said gate, directing a laser beam (21) to impinge upon adjacent areas of the gate and one of said overlapping portions and the drain region, and controlling the power (P), the diameter (D), the number (N) and duration (T) of the pulses of the laser beam so as to definitively create in the dielectric layer a zone of a low electrical resistance comprising a portion of said dielectric layer under said one overlapping portion of the gate and an adjacent portion outside the gate, wherein said laser beam impingement produces no opening through said one overlapping portion of the gate, said zone and said biasing means thus operating to turn said transistor on.

35. A method of programming a circuit path (27, 28) on a substrate (12) of an integrated circuit (10), the circuit path including an MOS transistor (11) having a source region (14), a drain region (15), a dielectric layer (17) and a gate (16) on a face of the substrate (12) of the integrated circuit (10), said gate connected to means biasing the transistor, comprising:

providing the gate with an extension conductor (31) having a portion outside the source region and a portion projecting over said source region over the dielectric layer (17), forming an electrical connection (22) by laser between the projecting portion of the extension conductor and the source region, wherein said biasing means (Vo, 25) is disabled by said electrical connection.

36. A method of programming a circuit path (27, 28) on a substrate (12) of an integrated circuit (10), the circuit including an MOS transistor (11) having a source region (14), a drain region (15), a dielectric layer (17) and a gate (16) on a face of the substrate (12) of the integrated circuit (10), the source and drain regions extending underneath respective overlapping portions of the gate and the gate being connected to means for biasing the transistor, comprising:

directing a laser beam (21) to impinge upon adjacent areas of the gate, one of said overlapping portions and the source region, and controlling the power (P), the diameter (D), the number (N) and duration (T) of the pulses of the laser beam so as to definitively create in the dielectric layer a zone of a low electrical resistance comprising a portion under said one overlapping portion of the gate and an adjacent portion outside the gate, wherein said laser beam impingement produces no opening through said one overlapping portion of the gate, and wherein said biasing means is disabled by said electrical connection.

* * * * *